(12) United States Patent
Trost (10) Patent No.: US 6,888,619 B2
(45) Date of Patent: May 3, 2005

(54) POSITIONING DEVICE (76) Inventor: David Trost, 1201 California St., San Francisco, CA (US) 94109

(*) Notice: Subject to any disclaimer, the term of this patent is extended or adjusted under 35 U.S.C. 154(b) by 62 days.

(21) Appl. No.: 10/394,839

(22) Filed: Mar. 21, 2003

(65) Prior Publication Data
US 2004/0184020 A1 Sep. 23, 2004

(51) Int. Cl.[7] .......................... G03B 27/58; G03B 27/42
(52) U.S. Cl. ........................... 355/72; 355/53; 318/648
(58) Field of Search ................ 310/10, 12; 318/687, 318/135, 38, 648, 649; 355/30, 53, 72

(56) References Cited

U.S. PATENT DOCUMENTS

| | | | |
|---|---|---|---|
| 4,485,339 A | | 11/1984 | Trost .......................... 318/640 |
| 5,997,963 A | * | 12/1999 | Davison et al. .............. 427/582 |
| 6,316,849 B1 | | 11/2001 | Konkola et al. .............. 310/12 |
| 6,583,597 B2 | | 6/2003 | Tanaka et al. ............... 318/687 |
| 6,590,633 B1 | * | 7/2003 | Nishi et al. ................... 355/53 |
| 6,603,130 B1 | * | 8/2003 | Bisschops et al. ........ 250/492.1 |
| 2002/0089657 A1 | | 7/2002 | Okubo |
| 2002/0154839 A1 | | 10/2002 | Trost |
| 2003/0043357 A1 | * | 3/2003 | Shimoda ........................ 355/53 |

* cited by examiner

Primary Examiner—Alan Mathews
(74) Attorney, Agent, or Firm—Patent Law Group LLP; Brian D. Ogonowsky (57) ABSTRACT This invention is directed to precision positioning devices which are well suited to manufacturing and inspection of semiconductor devices. A pair of coil assembles are attached to a base plate. The base plate forms a static portion of a gas bearing assembly. A carriage assembly, forming a movable portion of the gas bearing assembly, is capable of in-plane motion over the coil assembly. The carriage assembly contains permanent magnets and a soft magnetic bridge. A metrology component, such as a mirror, is attached to the carriage kinematically. Three in-plane constraints consist of substantially straight line connections between the metrology component and the carriage in a plane substantially parallel to the plane of motion of the gas bearings. Three out-of-plane constraints on the metrology component comprise substantially straight line connections between it and the gas bearings. The positioning device is operable in vacuum by directing the flow of gas out of the bearings to a vacuum pump. The positioning device is further capable of creating an area of low stray magnetic fields through the use of moving magnetic shielding material.

18 Claims, 11 Drawing Sheets

POSITIONING DEVICE

FIELD OF THE INVENTION

This invention relates to gas bearings comprising a carriage assembly and a static base assembly and, in particular, to a gas bearing articulated stage that is for use in a vacuum environment such as in a semiconductor wafer process chamber.

BACKGROUND OF THE INVENTION

This invention relates to a positioning device, also called a stage, for placing an object in a precise position, or for moving an object with precision. Devices of this kind have myriad applications and are of particular use in the manufacturing of semiconductors. Semiconductor manufacturing processes that involve the use of stages can include: lithography, inspection, pattern generation, wire bonding and others. In recent years, newer forms of many of these processes are performed in vacuum and require an environment with very low stray magnetic fields. This invention is especially suitable to these applications.

With traditional stages, in order to move an object in three or more degrees of freedom, it was necessary to employ three or more individual bearing systems, each with a single degree of freedom, X, Y and $\theta_z$ for instance, where $\theta_z$ is rotation about the Z axis. Each of these degrees of freedom had its own single degree of freedom drive such as a lead screw or linear motor. These single degree of freedom bearing and drive systems were cascaded in series with each other. This required a number of massive structural components in series with a number of bearings with their associated compliances. This resulted in modes of resonance at lower frequencies than desirable as well as friction, backlash, and other inaccuracies of movement.

More recently, in order to overcome these difficulties, stage devices have been devised with fewer components articulating with respect to each other. Devices of this kind include U.S. Patent Documents:

| | | |
|---|---|---|
| Re 27,289 | February 1972 | Sawyer |
| Re 27,436 | July 1972 | Sawyer |
| 4,485,339 | November 1984 | Trost |
| 4,506,204 | March 1985 | Galburt |
| 4,506,205 | March 1985 | Trost, Galburt |
| 4,507,597 | March 1985 | Trost |
| 4,655,594 | April 1987 | Wittekoek, Bouwer |
| 5,327,060 | July 1994 | Van Engelen, Bouwer |

These devices are generally aimed at higher resonant frequencies, allowing higher bandwidth servo control, as well as minimization of friction through the use of fluid film bearings such as air bearings. Many of them specifically employ the use of mirrors attached to moving elements of the stage. The position of these mirrors may be measured precisely by interferometer systems that are used to provide feedback for positioning the stage.

Since the mirror is the element of the stage that is measured in the feedback system, ideally, the mirror should be connected as directly as possible to the drive elements in those degrees of freedom in which the mirror moves. Likewise, the mirror should ideally be connected as directly as possible to the bearings in those degrees of freedom in which the stage is constrained, by the bearings, not to move. This invention relates to a stage that accomplishes these goals in a more effective manner than in previous efforts.

The present invention relies on the use of gas bearings to essentially eliminate friction and its deleterious effects on accuracy and other aspects of stage performance such as vibration. Similarly, it makes use of Lorentz force drives, and specifically allows for the use of non-commutated Lorentz force drives. As is well known to those skilled in the art, these properties contribute significantly to the performance and accuracy of the stage.

In recent years, as the semiconductor industry has progressed toward smaller sizes of transistors and other features on electronic microcircuits, it has been moving gradually away from stages that operate in air to stages that operate in vacuum for lithography, pattern generation and inspection applications. This is because when light is used for these applications, it must be of shorter wavelength, and as the wavelength gets shorter, air becomes less transparent. Wavelengths that do not propagate well through air are known as "vacuum ultraviolet" and "extreme ultraviolet." In addition, electron optical and other charged particle optical devices are used which also require vacuum. These charged particle optical systems are sensitive to stray magnetic fields that can be generated by a stage system, and particularly a Lorentz force system.

Previous stages have made use of gas bearings and Lorentz force motors in vacuum:

| | | |
|---|---|---|
| 4,417,770 | November 1983 | Tucker |
| 5,784,925 | July 1998 | Trost |
| Trost, "Using Air Bearings in Vacuum to Control Stage Vibration," Semiconductor International, July, 2002, pp 165–168 | | |
| 6,445,440 | September 2002 | Bisschop et al |

U.S. Pat. Nos. 4,417,770 and 5,784,925 employ flexible bellows to separate the exhaust of the gas bearings from the high vacuum environment. U.S. Pat. Nos. 5,784,925 and 6,445,440 as well as Trost, "Using Air Bearings in Vacuum . . . " employ differentially pumped scavenging systems to limit the amount of bearing exhaust gas that flows into vacuum environments. U.S. Pat. No. 6,445,440 uses flat air bearings at a feed through between the atmosphere and the vacuum environment, and the Trost article describes bearings of a cylindrical (journal) construction entirely within the vacuum chamber.

Gas bearings are constructed to have two elements that move with respect to each other. Generally one element is fixed, and the other moves. The two elements have a pair of complementary conforming surfaces with a small gap between them that allows relative motion while maintaining a relatively fixed gap. These surface pairs, often referred to as articulating surfaces, may be constructed in a variety of shapes that allow different types of relative motion. Spherical bearing surface pairs, for instance, allow the moving part of the bearing to articulate in three rotational degrees of freedom. Cylindrical bearing surface pairs (journal bearings) allow motion in two degrees of freedom; a translation along the cylinder axis and a rotation about the cylinder axis. Conical bearing surface pairs allow a single degree of freedom defined as rotation about the axis of the cone. Flat surface pairs allow for relative motion in three degrees of freedom defined by a pair of orthogonal translations X and Y and a rotation about the mutually orthogonal Z axis. This rotation is referred to as $\theta_z$. Bearing types are often defined by the shape of their articulating surfaces. Thus bearings with flat articulating surfaces are referred to as flat bearings.

The use of flat bearings is desirable since they are more easily constructed to the necessary tight tolerances and less expensive than other types. Similarly, the use of air bearings entirely within the vacuum chamber is desirable since the vacuum chamber tends to distort under the load of atmospheric pressure when the air is pumped out of the chamber. This distortion makes the use of air bearings at a feed through difficult. This invention employs flat bearings entirely within the vacuum chamber, not located at a feed through, to achieve maximum benefit from air bearing technology in vacuum.

Existing technology for vacuum stage systems employs fixed magnetic shielding attached to the vacuum chamber or comprising the vacuum chamber. This keeps magnetic fields from outside the chamber from penetrating to the interior. It also helps to reduce magnetic fields generated inside the chamber from exceeding requirements at critical areas close to the vacuum chamber wall or fixed shield. Generally magnetic components of the stage are placed outside the vacuum chamber, or within the vacuum chamber but at sufficient distance from critical areas to minimize stay fields. This forces current stage designers to limit the use of magnetic materials in the stage, or to choose magnetic components with very low stray fields, and to place them far from critical areas. The inventive device overcomes many of these limitations.

SUMMARY OF THE INVENTION

One embodiment of the invention has for its purpose to provide a positioning device, also referred to as a stage, capable of very high accuracy through the use of Lorentz force drivers comprised of coils and magnets, gas bearings substantially flat in configuration, and an optical or other element, such as a mirror, which may be used to determine the location of the positioning device by interferometric or other means. Typically, an optical system such as an interferometer or autocollimator reflects light off the mirror to determine its location and/or orientation with great precision. This mirror or other element, such as an encoder, is referred to as the metrology component.

A moving magnet assembly, consisting of at least one permanent magnet and at least one soft magnetic component, is supported on a nominally fixed coil assembly by at least one nominally flat gas bearing, or a plurality of gas bearings in a fixed, in-plane, spatial relationship to one another, to achieve these ends. These elements are arranged in such a way that when a current is caused to flow through at least one coil in the coil assembly, a Lorentz force is generated, causing the magnet assembly to move with respect to the coil assembly. The magnet assembly is capable of moving with respect to the coil assembly in at least two degrees of freedom (X and Y) and possibly three degrees of freedom (X, Y and $\theta_z$), where X and Y are translations along the respective axes, and $\theta_z$ is rotation about the Z axis. These are referred to as the "in-plane" degrees of freedom.

The metrology component, typically a mirror, is mounted to the magnet assembly and the gas bearing or bearings. The metrology component may be mounted to these other components such that it is fixed with respect to them, or such that it can move with respect to them in any or all of the remaining three degrees of freedom ($\theta_x$, $\theta_y$, and Z). These are referred to as the "out-of-plane" degrees of freedom. In any event, the metrology component is mounted to the magnet assembly in such a way that as direct and rigid a connection as is practical is maintained between the magnet assembly and the mirror in the in-plane degrees of freedom. In this way, when Lorentz forces cause the magnet assembly to move in any of these degrees of freedom, the frequencies of the resonant modes of vibration between the magnet assembly and the metrology component that most affects their relationship in these degrees of freedom are maximized. This allows the metrology component to follow the motion of the magnet assembly with the highest possible fidelity, resulting in better stage performance.

Similarly, in the out-of-plane degrees of freedom, the metrology component is connected to the gas bearings in the most direct way practical. The gas bearings are elements that are constrained to move in the plane of motion defined by the coil assembly. The metrology component is therefore referenced to the gas bearings in the most direct manner possible in the out-of-plane degrees of freedom. In the event that the stage has no capability to move in the out-of-plane degrees of freedom, the mirror is connected to the gas bearings in the most rigid manner practical. In the event that the stage is intended to move in the out-of-plane degrees of freedom, it incorporates an actuator such as a voice coil, piezoelectric device, or screw for each of the desired degrees of freedom. These actuators are on one end attached as directly as possible to the gas bearing, and on the other end, as directly as possible to the metrology component. This maximizes the fidelity of the motion of the metrology component in the out-of-plane degrees of freedom. It is also necessary that the six constraints described above (X, Y, Z, $\theta_x$, $\theta_y$, $\theta_z$) are implemented in such a way that they do not cause the metrology component to distort since distortion of the metrology component can lead to errors in measurement of the stage position. Mounts of this type that are capable of rigid constraint while minimizing distortion are known to those skilled in the art as kinematic mounts.

The use of plane gas bearings has several useful benefits. One of them is that the stage can be built with a minimum number of bearings. As few as one gas bearing may be used, although for practical reasons more may be desired. Minimizing the number and size of gas bearings is particularly useful when there is intent to operate the stage in vacuum, as this minimizes the leakage of gas from the bearings into the vacuum environment.

In some applications in the semiconductor industry, an object such as a silicon wafer or a reticle substrate is mounted to the metrology component. The system can be sensitive to stray magnetic fields in this location that are generated by the magnets and coils. In some embodiments of this invention, the design is optimized to reduce these stray fields. This is accomplished through the use of high permeability material for the soft iron components of the magnet assembly. In addition, moving magnetic shielding material may be added to further shield from stray fields.

The above summary is a summary of the preferred embodiment and is not intended to limit the scope of the claims.

DESCRIPTION OF THE PREFERRED EMBODIMENTS

Figure 3:
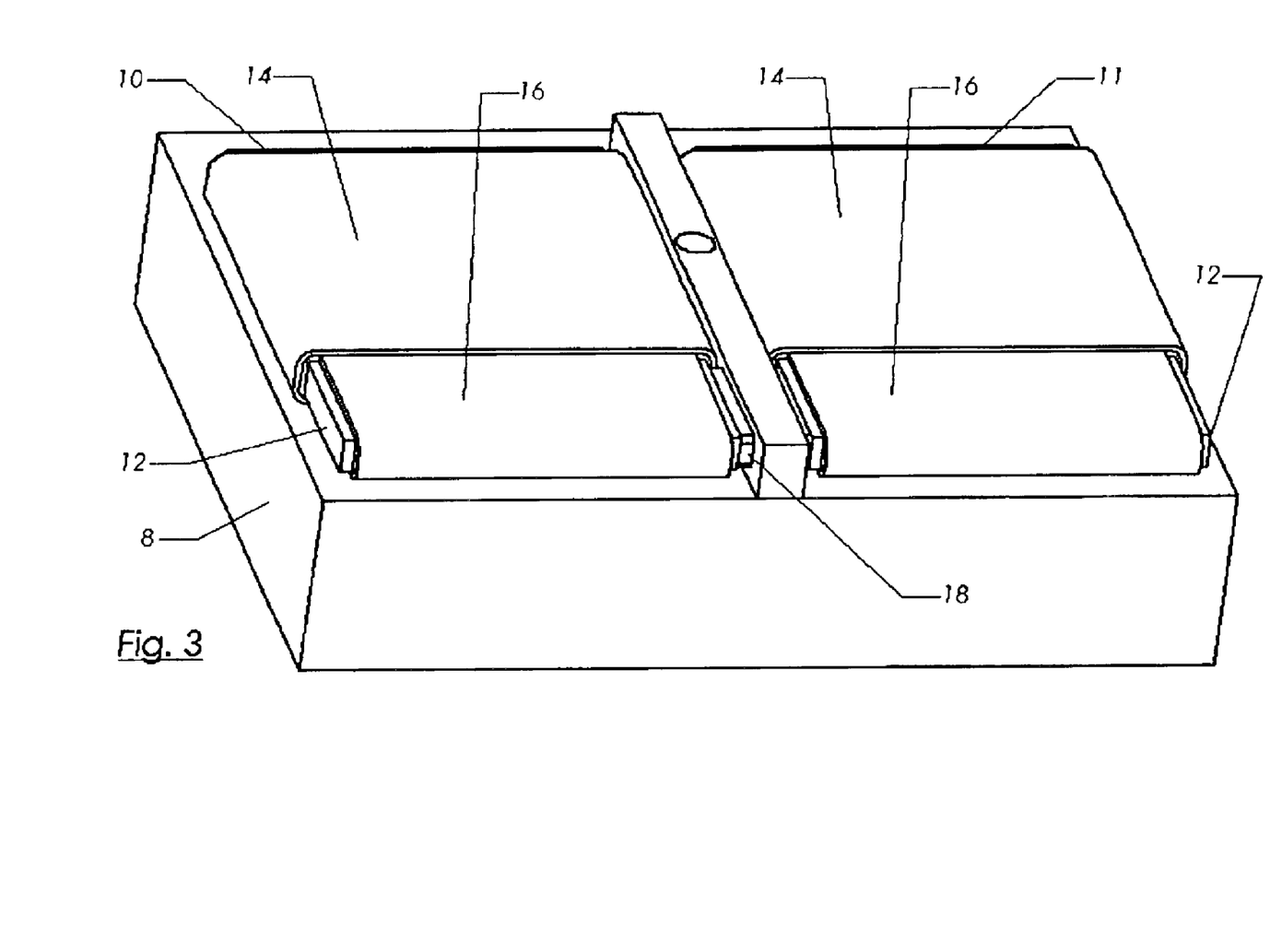
FIG. 3 is a perspective view of a part of the stage stator.

The preferred embodiment includes a base structure 6 (FIG. 3), which forms the stage stator. This is the part of the stage that is nominally stationary. The base structure 6 includes a rigid structural base plate 8, to which are mounted two coil assemblies 10 and 11. Each coil assembly consists of a soft magnetic core 12, which readily conducts magnetic flux, and a pair of wire coils 14 and 16 wound in orthogonal directions about the core. A connector made of soft magnetic material 18 creates a magnetic flux bridge between the cores of the two coil assemblies. A plate of nonmagnetic and nonconducting material 19 (shown as transparent to reveal the coil assemblies) covers the coils to provide a hard, smooth and nominally flat surface for the movable portion of the gas bearings to glide on.

Figure 1:
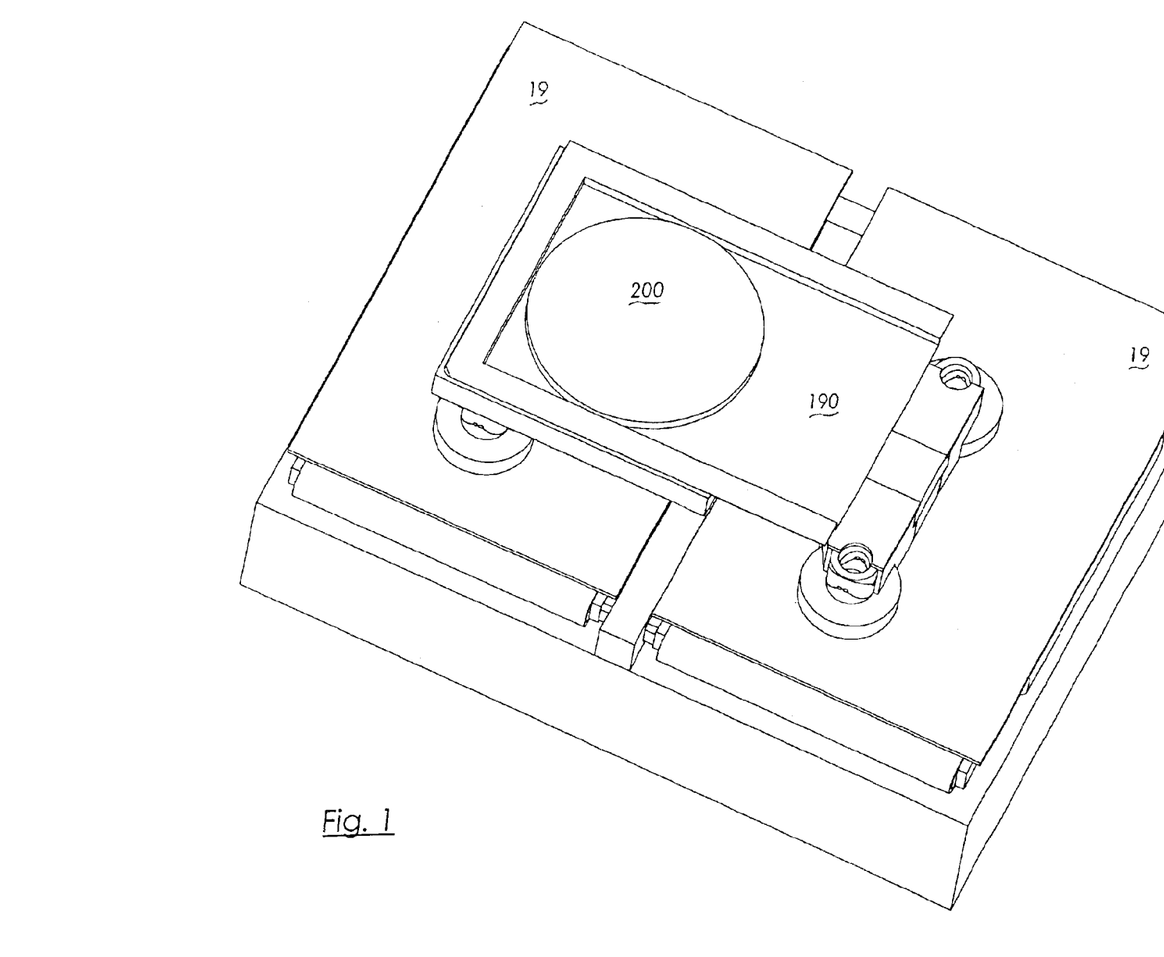
FIG. 1 is a perspective view of the stage.
Figure 1A:
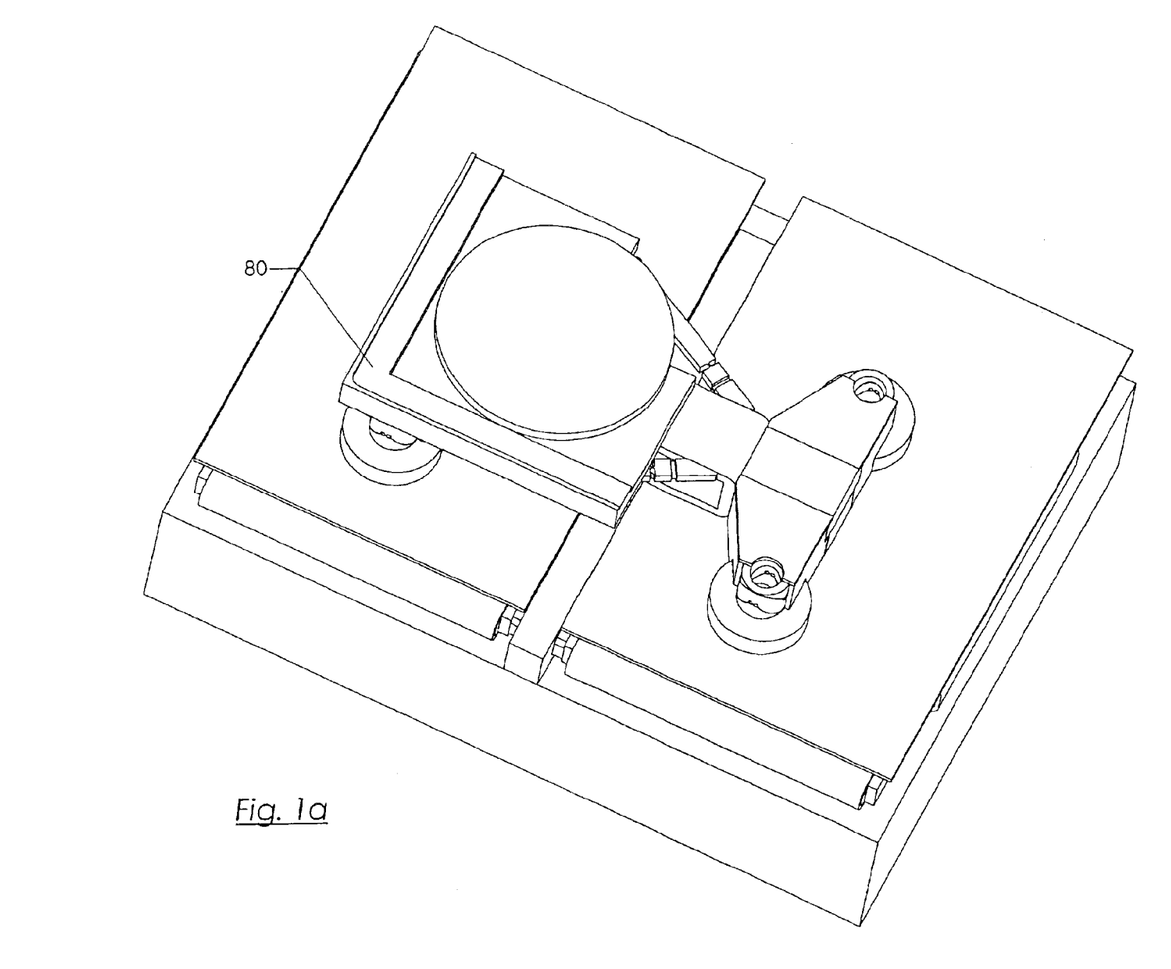
FIG. 1a is a perspective view of the stage with the magnetic shield removed for clarity.
Figure 2:
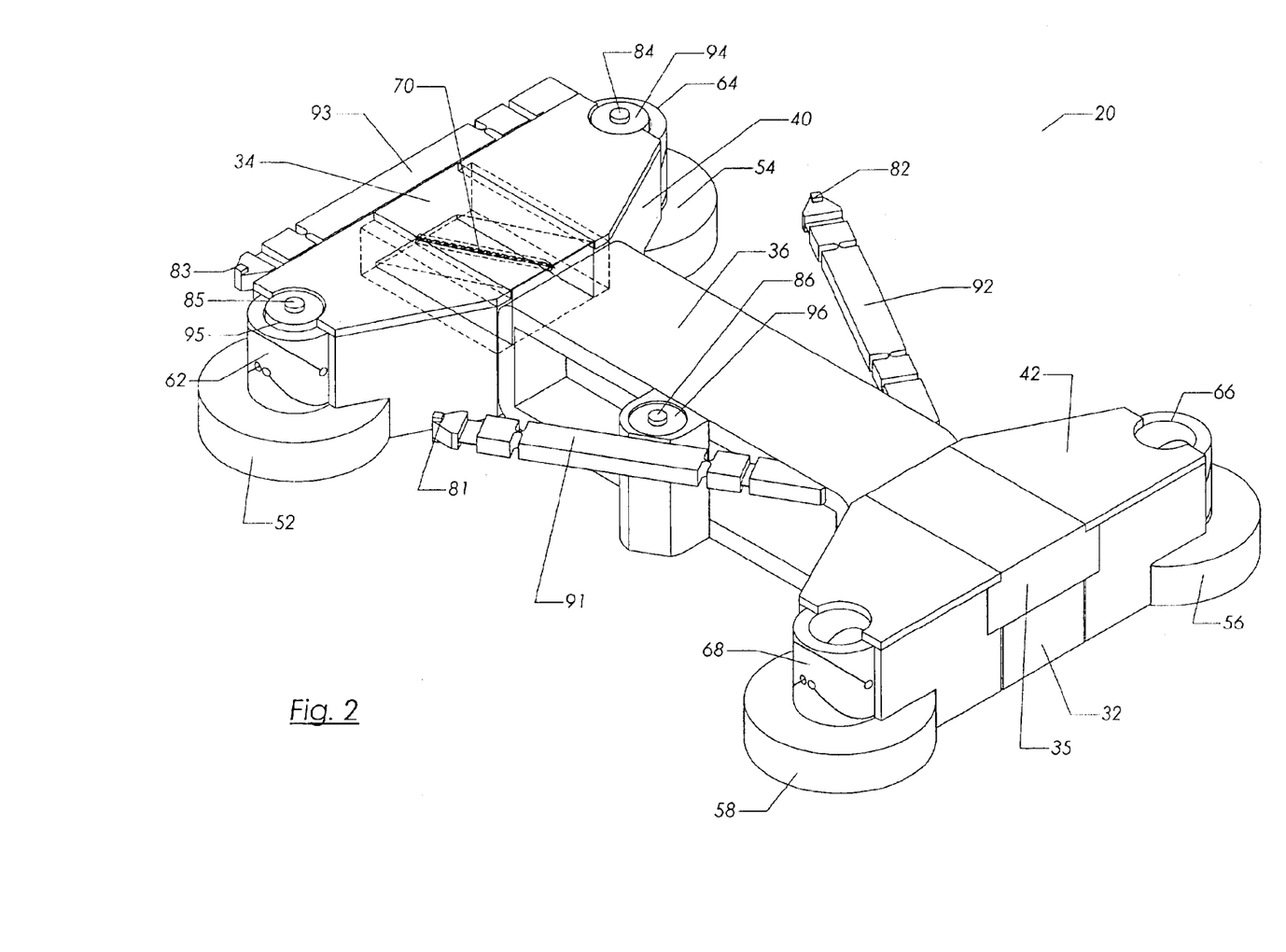
FIG. 2 is a perspective view of a part of the stage carriage.
Figure 2A:
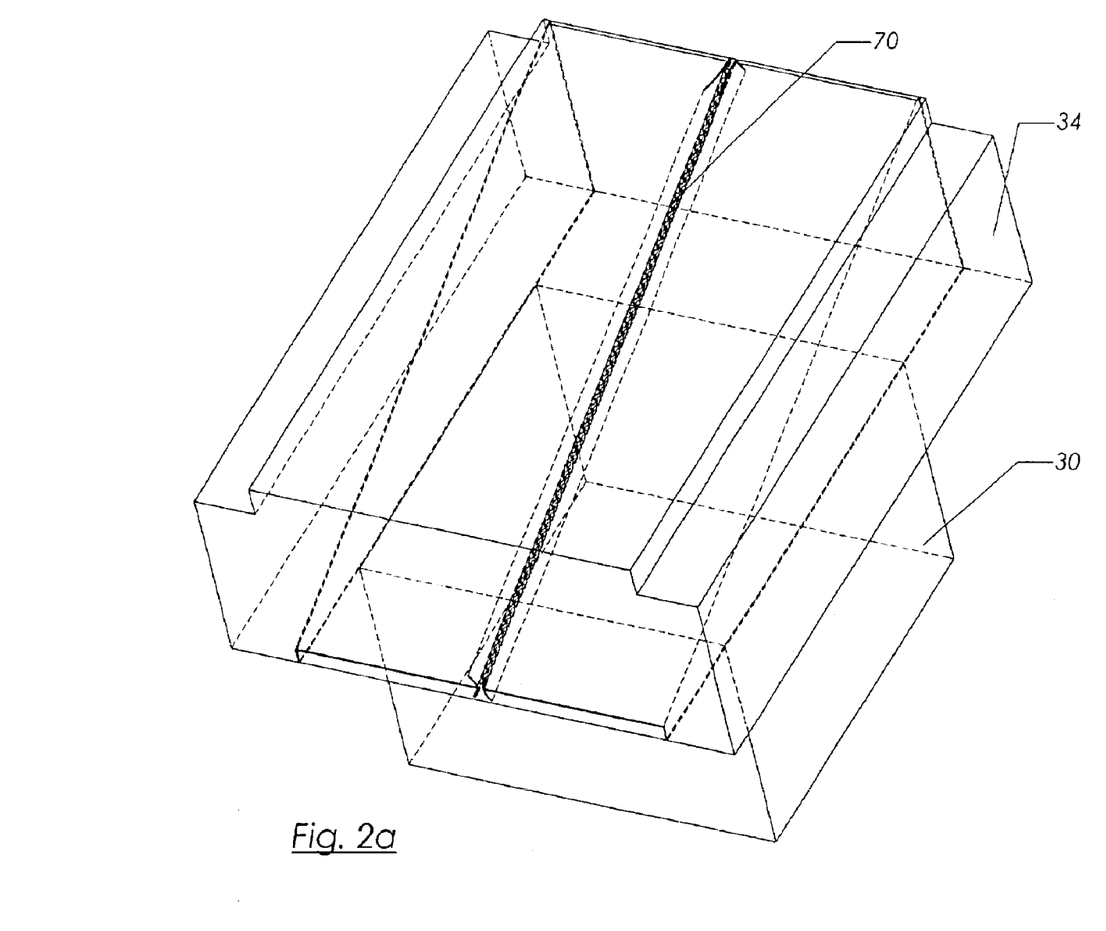
FIG. 2a is a perspective view of magnet and its associated pole piece containing an internal pivot flexure

The moving part of the stage, referred to as the carriage 20 (FIGS. 2, 2a), contains two permanent magnets 30 and 32, one with its north pole facing a coil assembly, and the other with its south pole facing the other coil assembly. A pair of magnetic pole pieces 34 and 35 carry magnetic flux from the magnets. A second soft magnetic connector 36 carries magnetic flux between the two pole pieces. A magnetic attraction pulls each of the magnets toward the base plate 8. Two transverse beams 40 and 42 are employed, one for each magnet, to support the magnets above the base plate 8. At each end of each of the beams, a gas bearing (four total 52, 54, 56, 58) supports the beam on the base plate while allowing the carriage to move freely in-plane. Each of the gas bearings is attached to its associated beam through a bidirectional pivot flexure (universal joint) 62, 64, 66, 68, and one of the beams is attached to the connector with a unidirectional pivot flexure 70. This is done so that the gas bearings may conform freely to the base plate 8 surface. The hidden lines of pole piece 34 are shown as dotted lines to make visible the internal cuts that provide the desired flexural properties of pivot flexure 70.

Figure 4:
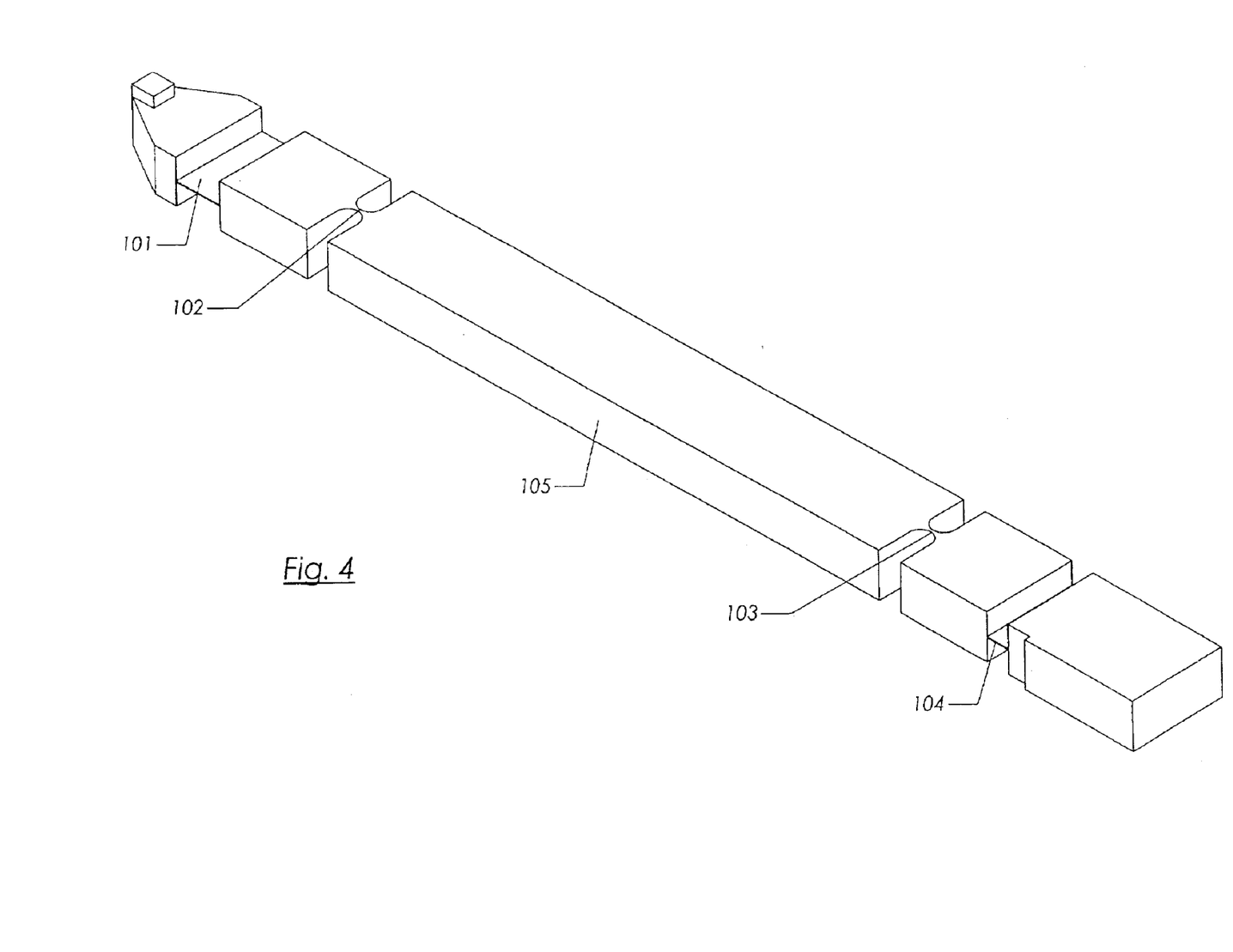
FIG. 4 is a perspective view of an axial flexure.

Also part of the carriage is a metrology component 80 (FIG. 8) consisting of a mirror. The mirror is attached to the rest of the carriage 20 at precisely six points 81, 82, 83, 84, 85, 86, forming a kinematic mount. Three of these connections 84, 85, 86, are on out-of-plane actuators 94, 95, 96 and three of them 81, 82, 83, are on in-plane axial flexure constraints 91, 92, 93. The in-plane flexure constraints are designed to be rigid as practical along their long axis, but as flexible as possible in all other axes. A typical configuration 93 for such an axial flexure is depicted in FIG. 4. A long metallic bar 105 of rectangular or round cross section is thinned down in four places 101, 102, 103, 104, producing areas that are flexible about the axes perpendicular to the long axis of the bar, as well as compliant in torsion about the long axis. Such a flexure is rigid in only one direction, along the long axis. Two of these axial flexures connect the magnetic connector to the metrology component, while a third axial flexure connects one of the beams to the metrology component. These three axial flexures are arranged in such a way as to rigidly connect the in-plane degrees of freedom of the metrology component 80 to the underlying magnetic assembly.

Figure 8:
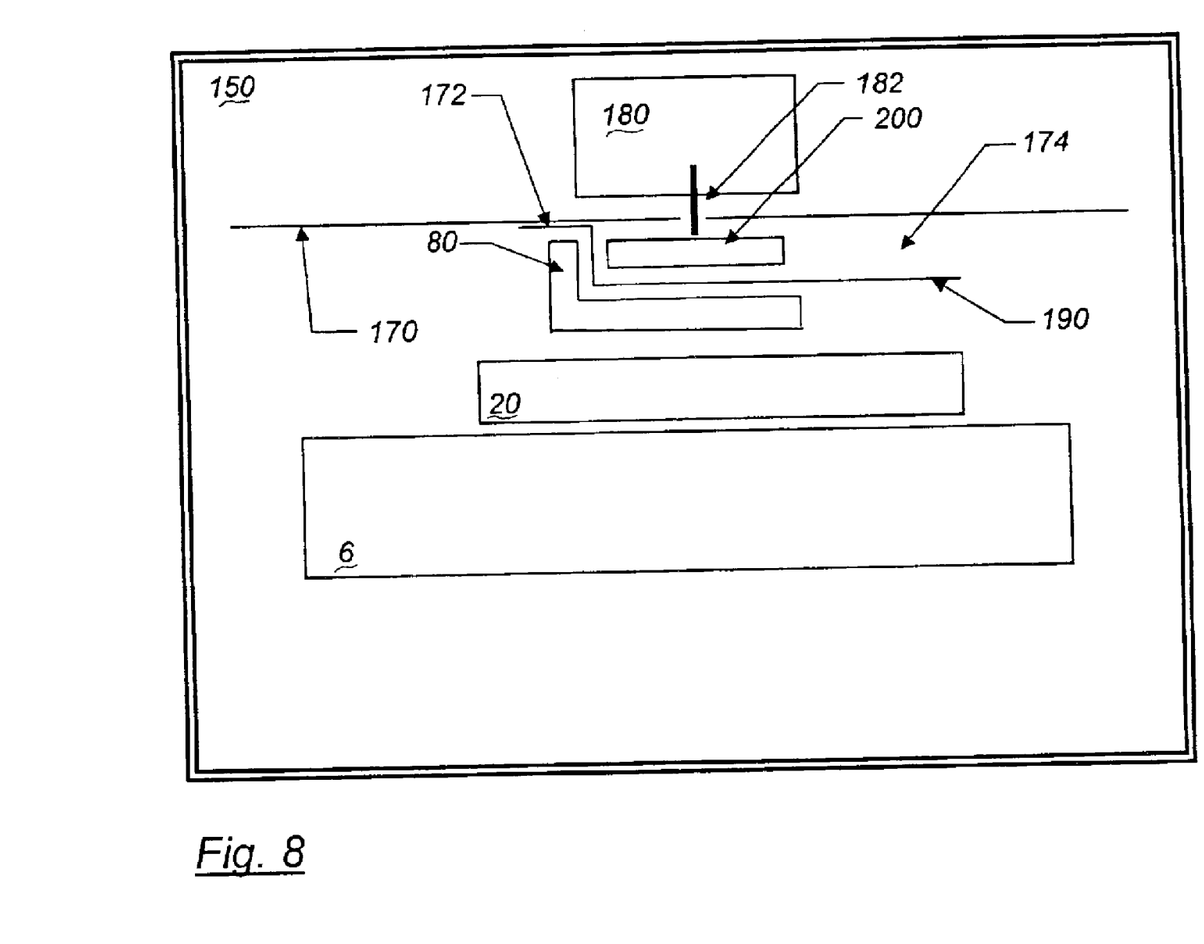
FIG. 8 is a diagram of the preferred embodiment of the magnetic shielding.

The out-of-plane motion of the metrology component is controlled by three out-of-plane actuators which may be piezoelectric devices, screws, voice coils, or other devices known to those skilled in the art. A first actuator 94 is mounted at one end to a gas bearing 54 and at the other end to the metrology component 80. A second actuator 95 is mounted at one end to a second gas bearing 55 and at the other end to the metrology component 80. The purpose of the direct connections the actuators provide between the metrology component and the gas bearings is to allow the load path from the metrology component to the gas bearing to be substantially a straight line. A third actuator 96 is mounted at one end to the magnetic connector between the two magnets 36, and at the other end to the metrology component 80. By maximizing the efficiency of the way the out of plane loads are transferred from the metrology component to the gas bearings, resonant frequencies are maximized, and system performance is enhanced.

Figure 5:
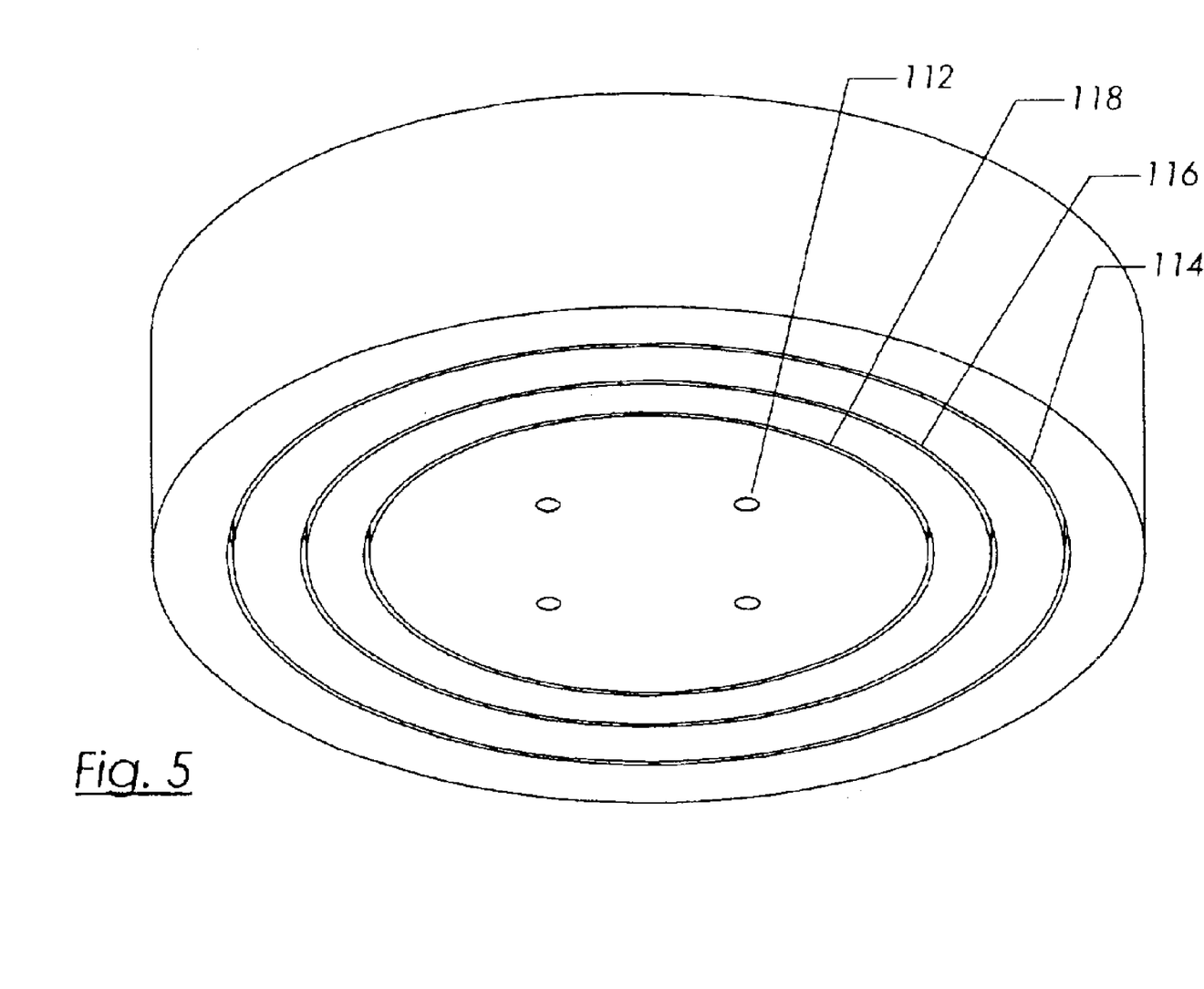
FIG. 5 is a perspective view of an underside of a gas bearing.

Gas flow between the complementary surfaces of the gas bearings is introduced through orifices or other compensating elements 112 (FIG. 5). When operation of the stage is required in vacuum, the gas bearings may employ known techniques (Trost, "Using Air bearings in Vacuum . . . ") to scavenge the gas flowing out of the bearing so as to minimize the impact on the vacuum environment. When flat bearings are used, as in the inventive device, a multiplicity of grooves 114, 116, 118 are provided near the outer edge of the bearing. The gas escaping radially outward from the periphery of the bearing collects in the first groove 114 and is vented through a flexible tube 124 leading from the stage to the outside of the vacuum chamber 150. Subsequent grooves, progressively closer to the edge of the bearing are similarly vented to areas of progressively higher vacuum in the vacuum pumping system, according to techniques that are well known to those skilled in the art. This is described below with respect to FIG. 6.

Gas bearings in precision instruments generally operate with small clearance between their complementary surfaces. It is common for this clearance to be ten microns or less. For most useful bearing designs, the stiffness of the bearing is inversely dependent on the clearance (also called the gap) at which the bearing is designed to operate. Since stiff bearings are very useful in stage design in order to maximize resonant frequencies, minimizing bearing clearance is important. Similarly, the efficiency of the scavenging system has a strong inverse dependence on bearing clearance. The practical limit on how small the design clearance of the bearing may be results from limitations on the accuracy of the fabrication of the bearing components. Typically, the complementary bearing surfaces must be fabricated with errors of form no more than one quarter to one tenth of the bearing clearance. Since flat surfaces of great accuracy are more readily fabricated than other forms such as cylinders, it is practical to fabricate flat bearings designed for smaller clearances than other forms of bearings. It follows, therefore, that stages with flat bearings may be more readily designed and built for high resonant frequency and efficient scavenging of gasses flowing out of the bearing. That is an important goal of the inventive device. The gas bearings in the inventive device may be readily designed and built with bearing gaps less than five microns and in some cases less than three microns.

It is standard practice in the design of scavenged gas bearings for use in vacuum to vent the first scavenging groove to atmospheric pressure. This is because with the typical large bearing clearances used until now, the flow has been too great to be handled by a vacuum pump of reasonable size. The second and third grooves, and more if necessary, are then vented to sequentially decreasing pressure ports in the vacuum pumping system. With the small clearances in the flat bearings of the inventive device, it is possible to vent the first groove of the scavenging system to a vacuum pump, thus reducing the number of subsequent scavenging grooves required, and reducing the pumping capacity required for subsequent grooves. This is another advantage of the inventive device.

Figure 6:
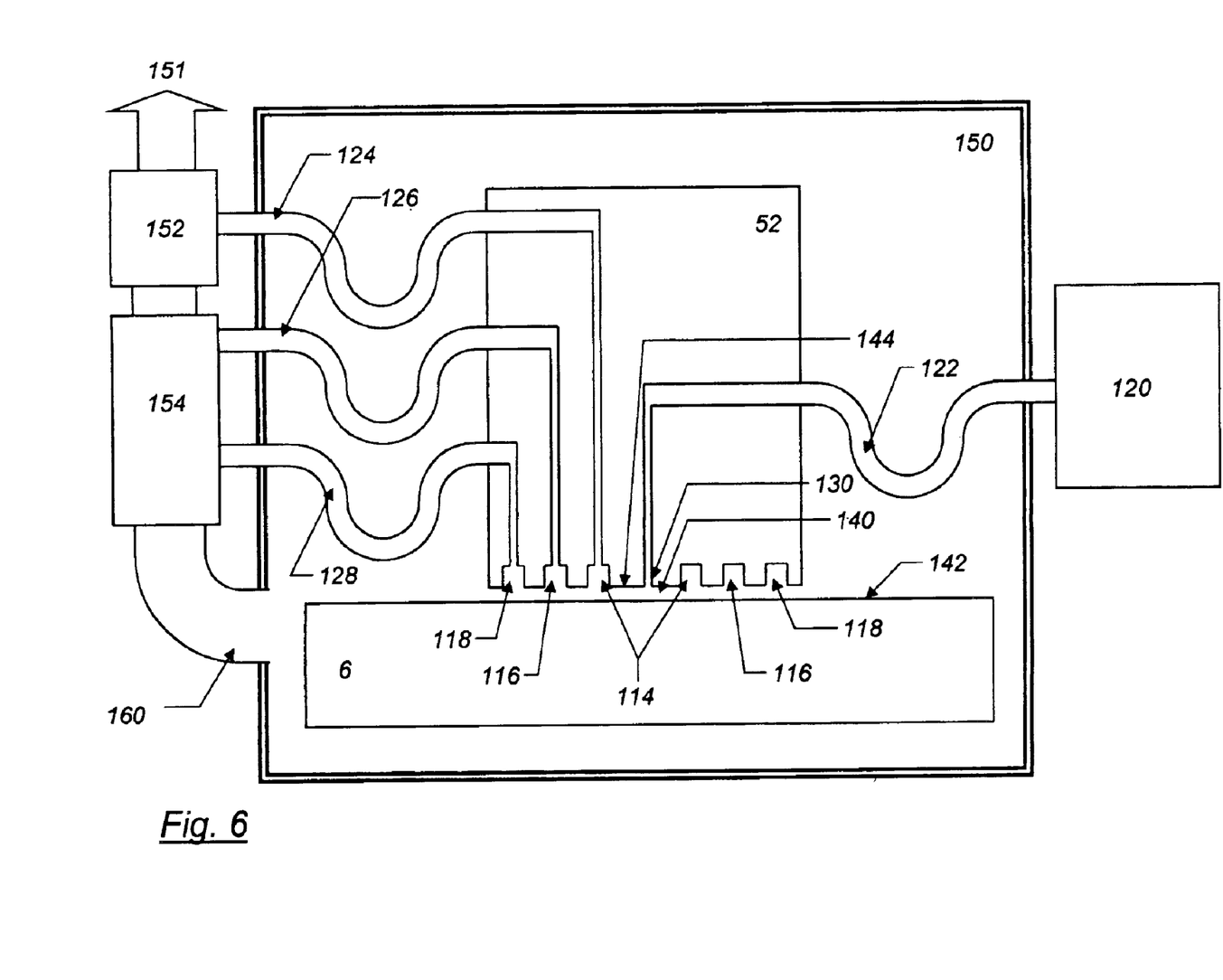
FIG. 6 is a schematic representation of the gas bearing and the vacuum system.

Referring to FIG. 6, the stage base structure or stator 6 is inside a vacuum chamber 150. A gas bearing, 52 for example, is movable in the plane over the stage stator. A supply of pressurized gas, such as air or dry nitrogen, is provided to the bearing by gas supply 120 outside of the vacuum chamber. The pressurized gas flows through the vacuum chamber wall and through a flexible tube 122 into the gas bearing. From there the gas flows through a flow restricting element 130 and into the gap 140 between the complementary flat bearing surfaces 142 and 144. From there the gas is collected in a first groove 114. The majority of the gas then flows through a flexible tube 124 to a relatively high pressure part of the vacuum pumping system 152 called the roughing pump. It will be understood that while this represents high pressure with respect to the remainder of the vacuum system, the pressure in this part, and all parts of the vacuum pumping system, is below atmospheric pressure. The roughing pump expels this gas to the atmosphere 151.

The complementary bearing surfaces are continued beyond the first groove 114, and a small amount of gas flows in the continuation of the gap 140 to a second collection groove 116. The majority of the gas collecting in this second groove 116 flows through a second flexible tube 126 into a high pressure section of the high vacuum pump 154. It will be understood that the pressure in this part of the high vacuum pump is lower than the roughing pump. A small amount of gas in the bearing continues to flow through the continuation of the gap 140 to a third collection groove 118. The majority of the gas from groove 118 flows through a third flexible tube 128 to a lower pressure port of the high vacuum pump. The lowest pressure port 160 of the vacuum pump is called the main vacuum port. It is connected to the main volume of the vacuum chamber 150. A small amount of the gas that collects in the third collection groove 118 continues to flow through the extension of the bearing gap 140 into the main volume of the chamber where it is pumped out through main vacuum port 160. In this way gas bearings are able to operate inside a vacuum chamber.

The inventive device also provides for the minimization of magnetic fields in those areas where electron optical or other sensitive elements may be used. This is accomplished through selection of the materials used in the construction of the stage as well as the use of moving magnetic shielding which may be attached to the stage carriage.

It is common practice in stage and motor design to employ the use of magnetic bridging elements to carry magnetic flux between magnets and coil assemblies and the like. It is standard practice to use inexpensive materials such as low carbon steel to perform this bridging function, since steel it is capable of carrying high levels of magnetic flux. There are other, more expensive materials, including silicon iron, electrical steels, nickel iron alloys and cobalt iron-alloys that are also capable of carrying high levels of flux, but with a lower stray magnetic field. The inventive device uses these materials to minimize stray fields.

Referring to FIG. 8, a fixed magnetic shield 170 typically made of a nickel iron alloy such as one of a variety of commercial alloys that use the trade name Permalloy, is employed near the top of the chamber 150 but below the electron optics 180. The electron beam 182 propagates through an aperture in the fixed shield. A moving magnetic shield 190 is added between the metrology component 80 and the wafer or reticle or other work piece 200. This provides a highly shielded area for the work piece and the electron beam regardless of stage position.

Figure 7:
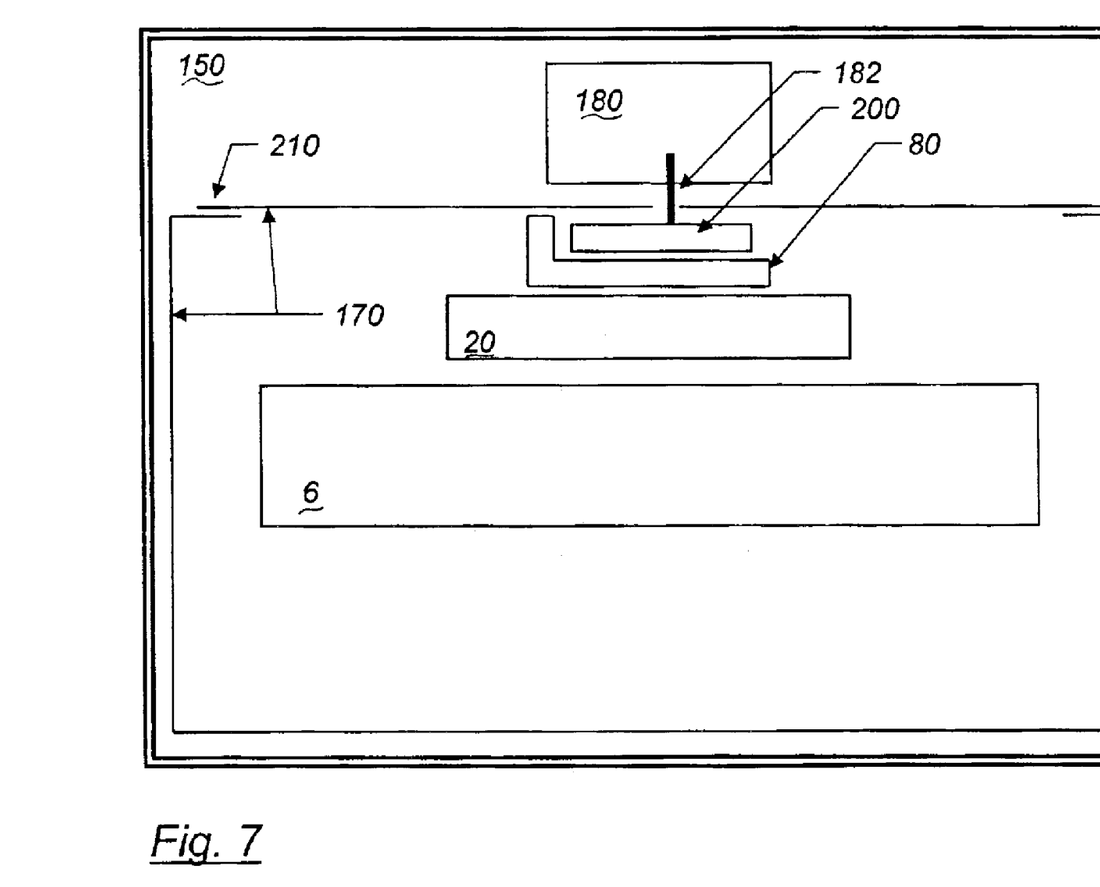
FIG. 7 is a diagram of a prior art magnetic shielding configuration.

Because the shield consists of both a fixed piece and a moving piece, there must be gaps between the components of the shielding to avoid friction during motion. The field leakage through these gaps can be made very small through known techniques used for fixed shielding installations. Referring to the prior art FIG. 7, it can be seen how with existing technology, separate components of the fixed shield are made to overlap in such a way 210 that the length of the overlap is equal to or grater than the size of the gap between shield components. The more stringent the stray magnetic field requirements are made, the greater is made the ratio of overlap to gap. A similar technique may be employed with a gap 172 between fixed and moving shield elements.

The preferred embodiment depicted in FIG. 8 shows one side of the moving shielding where the gap is left intentionally larger in order to provide a clear path for inserting and removing work pieces. On this side, the moving shielding is extended further than on other sides so as to maintain the desired ratio of overlap to gap 174, while allowing a gap large enough to insert and remove a work piece. Other configurations of moving shielding will be understood to be possible to those skilled in the art.

Figure 9:
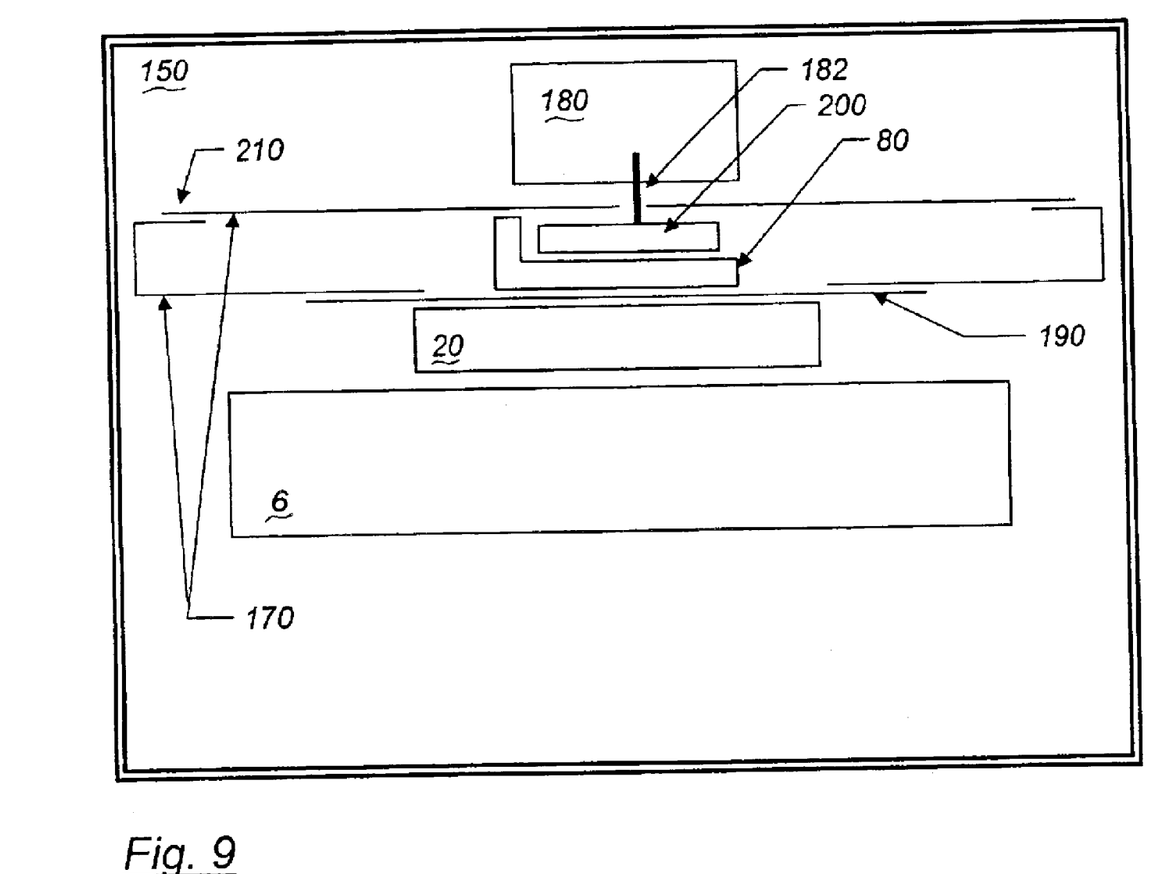
FIG. 9 is a diagram of an alternate magnetic shielding configuration.

Referring to FIG. 9, one alternative arrangement may place the magnetic shield between the metrology component and the rest of the stage carriage.

While particular embodiments of the present invention have been shown and described, it will be obvious to those skill in the art that changes and modifications may be made without departing from this invention in its broader aspects and, therefore, the appended claims are to encompass within their scope all changes and modifications that fall within the true spirit and scope of the invention.

What is claimed is:

1. A positioning device for operating within a vacuum chamber in a vacuum environment at a pressure of one torr or lower, said positioning device comprising:
at least one gas bearing comprising a static portion and a movable portion having opposing substantially flat surfaces that allow relative motion with respect to one another, said at least one gas bearing being located entirely within said vacuum chamber,
the movable portion being movable over the opposing substantially flat surface of the static portion in at least two degrees of freedom, all forces produced by said at least one gas bearing that are substantially perpendicular to said substantially flat surfaces acting on said movable portion in substantially the same direction, there being no gas bearings forming said positioning device providing a force substantially opposite to said forces in said substantially same direction; and
at least one magnet in said movable portion creating a magnetic attraction between said static portion and said movable portion to provide a force having a direction opposite to said forces in said substantially same direction.

2. The device as in claim 1 where said vacuum environment is characterized by a pressure of $10^{-3}$ torr or lower.

3. The device as in claim 1 wherein the of the movable portion of the at least one gas bearing comprises a multiplicity of movable portions constrained so as to have a substantially fixed in-plane spatial relationship to one another.

4. The device as in claim 3 where said vacuum environment is characterized by a pressure of $10^{-3}$ ton or lower.

5. The device as in claim 1 further comprising a semiconductor wafer supported by the movable portion.

6. The device as in claim 1, further comprising
at least one collection groove formed in the at least one gas bearing for collecting the gas flowing out of the at least one gas bearing; and
a flexible tube carrying the majority of said gas from said at least one collection groove to a vacuum pump.

7. The device of claim 1 further comprising:
a metrology component coupled to the movable portion for determining a position of said movable portion, said metrology component coupled to said movable portion by a kinematic mount with exactly six simultaneous substantially independent constraints in six substantially independent directions, at least one constraint of the kinematic mount forming a substantially straight line between the at least one gas bearing and the metrology component.

8. The device of claim 1 further comprising:
a metrology component coupled to the movable portion for determining a position of said movable portion, said metrology component coupled to said movable portion by a kinematic mount with exactly six independent constraints in six independent directions; and
at least one actuator for moving said metrology component with respect to said at least one gas bearing, a first end of said at least one actuator being attached to said at least one gas bearing, and a second end of said actuator, movable with respect to said first end, being attached to said metrology component, said at least one actuator being at least one constraint of the kinematic mount.

9. The device of claim 1 wherein a gap between the opposing substantially flat surfaces is less than five microns.

10. The device of claim 1 wherein a gap between the opposing substantially flat surfaces is less than three microns.

11. The device of claim 1 where the at least one gas bearing comprises at least two gas bearings, the opposing flat surfaces having a gap that is less than five microns, the gas bearings being flexibly connected to a carriage such that the gas bearings conform freely to the surface of the static portion while maintaining the gap substantially constant.

12. The device of claim 1 where the at least one gas bearing comprises at least two gas bearings, the opposing flat surfaces having a gap that is less than three microns, the gas bearings being flexibly connected to a carriage such that the gas bearings conform freely to the surface of the static portion while maintaining the gap substantially constant.

13. A positioning device comprising:
a base plate with a substantially flat surface;
a movable carriage containing at least one gas bearing adapted for movement over said flat surface in at least two degrees of freedom; and
a metrology component coupled to the carriage for determining a position of said carriage, said metrology component coupled to said carriage by a kinematic mount with exactly six simultaneous substantially independent constraints in six substantially independent directions,
at least one load carrying member forming at least one constraint of said kinematic mount, said at least one load carrying member attached at one end to said at least one gas bearing and at another end to said metrology component, said at least one load carrying member having an axis comprising a substantially straight line between said at least one gas bearing and said metrology component.

14. The device as in claim 13 further comprising a semiconductor wafer supported by the movable carriage.

15. A positioning device comprising:
a base plate with a substantially flat surface;
a movable carriage containing at least one gas bearing adapted for movement over said flat surface in at least two degrees of freedom;
a metrology component coupled to the carriage for determining a position of said carriage, said metrology component coupled to said carriage by a kinematic mount with exactly six simultaneous substantially independent constraints in six substantially independent directions; and
at least one actuator for moving said metrology component with respect to said at least one gas bearing, a first end of said at least one actuator being attached to said at least one gas bearing, and a second end of said actuator, movable with respect to said first end, being attached to said metrology component, said at least one actuator being at least one constraint of the kinematic mount.

16. The device as in claim 15 further comprising a semiconductor wafer supported by the movable carriage.

17. A method of moving an object in a vacuum chamber comprising:
placing said object on a movable carriage inside said vacuum chamber;
moving said object in more than one degree of freedom on complimentary substantially flat gas bearing surfaces inside said vacuum chamber, said complimentary substantially flat gas bearing surfaces comprising at least one gas bearing comprising a static portion and a movable portion forming part of said movable carriage that allow relative motion with respect to one another, said at least one gas bearing being located entirely within said vacuum chamber,
generating gas bearing forces by said at least one gas bearing that are perpendicular to a substantially flat surface of said static portion, all gas bearing forces produced by said at least one gas bearing that are substantially perpendicular to said substantially flat surface of said static portion acting on said movable portion in substantially the same direction, there being no gas bearings forming part of said movable carriage providing a force opposite to said forces in said substantially same direction; and
generating magnetic forces by at least one magnet in said movable carriage creating a magnetic attraction between said static portion and said movable carriage a provide a force having a direction opposite to said gas bearing forces in said substantially same direction.

18. The method as in claim 17 wherein the object is a semiconductor wafer.

* * * * *

UNITED STATES PATENT AND TRADEMARK OFFICE
CERTIFICATE OF CORRECTION

PATENT NO.    : 6,888,619 B2
DATED         : May 3, 2005
INVENTOR(S)   : David Trost It is certified that error appears in the above-identified patent and that said Letters Patent is hereby corrected as shown below:

Column 8,
Line 66, cancel "of the movable" and substitute -- movable --.

Column 9,
Line 5, cancel "ton" and substitute -- torr --.

Column 10,
Line 61, cancel "carriage a" and substitute -- carriage to --.

Signed and Sealed this

Twenty-ninth Day of November, 2005

JON W. DUDAS
*Director of the United States Patent and Trademark Office*